TEMPERATURE AND IMPEDANCE COMPENSATED VOLTAGE CONTROLLED VARIABLE FREQUENCY MULTIVIBRATOR

Filed Sept. 10, 1962

INVENTOR

Henry I. Boreen,

BY Paris, Haskell and Levine

ATTORNEYS

United States Patent Office 3,246,258

Patented Apr. 12, 1966

3,246,258

TEMPERATURE AND IMPEDANCE COMPENSATED VOLTAGE CONTROLLED VARIABLE FREQUENCY MULTIVIBRATOR

Henry I. Boreen, Elkins Park, Pa., assignor, by mesne assignments, to United Aircraft Corporation, a corporation of Delaware Filed Sept. 10, 1962, Ser. No. 222,345
15 Claims. (Cl. 331—113)

Figures 1, 2:
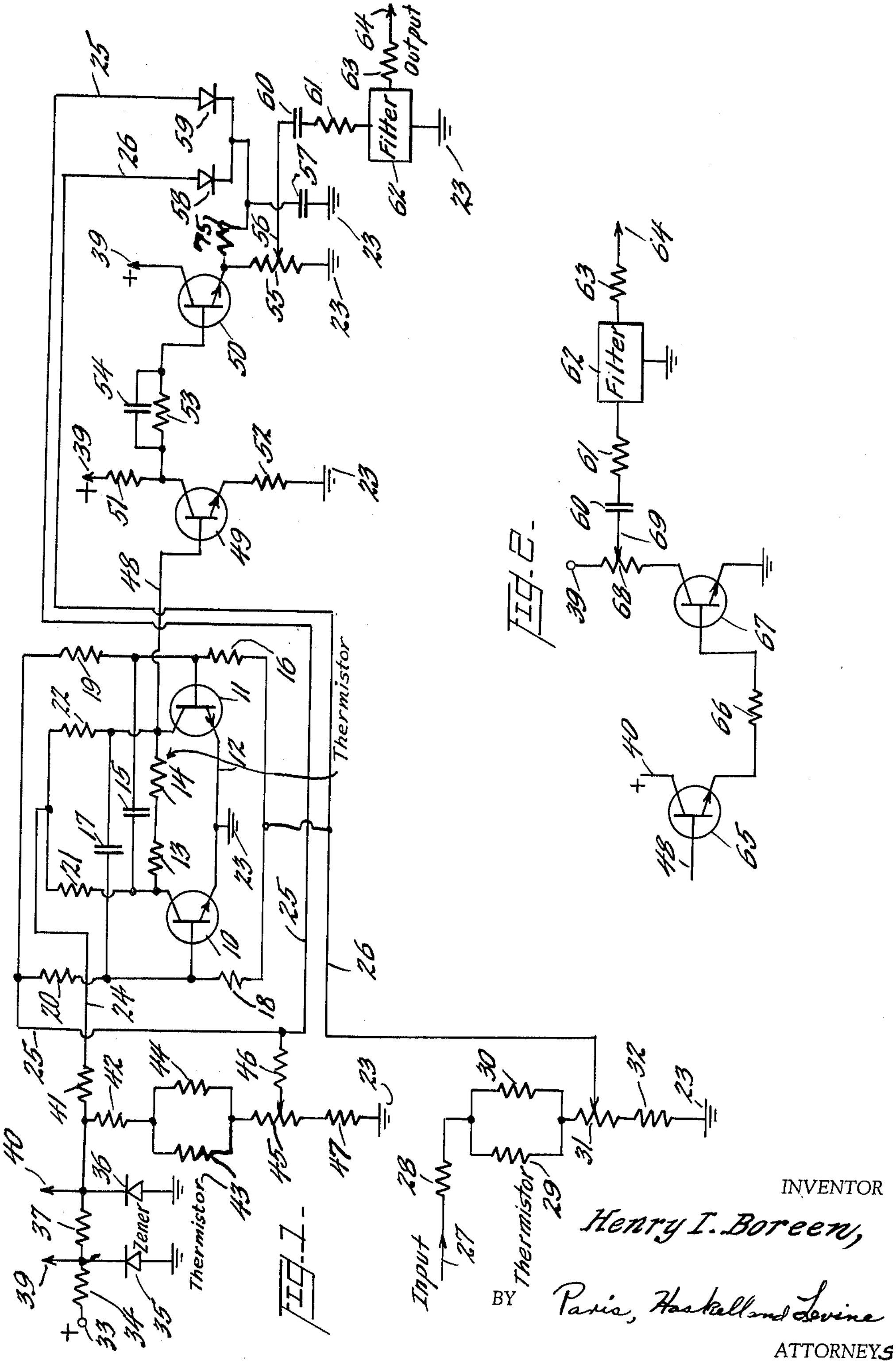

This invention generally relates to voltage controlled variable frequency oscillators, and is particularly concerned with improvement in miniature, temperature compensated transistor multivibrators that are useful, among other applications, as subcarrier oscillators in radio telemetering systems.

Generally, according to the invention, there is provided an improved variable frequency oscillator circuit for telemetering applications or the like that is adapted to be energized by a variable amplitude signal originating from a transducer or other measuring device, to produce a variable frequency output wave that is lineraly proportional in frequency to the amplitude of the input signal. The range of frequency deviation is etxensive, ranging from ±7½ to ±15% or greater, than the base frequency.

The preferred circuitry is comprised exclusively of transistors and other miniature circuit components having minimum power consuming capacity whereby the assembled components are extremely lightweight and occupy a very small volume as desired for aircraft, missile and like communication systems.

For compensating the oscillator against variations of the components with temperature, there is provided a unique arrangement of compensating impedances, preferably thermistors, having both positive and negative temperature coefficients, which serve to correct for temperature changes occurring both at the base operating frequency as well as at frequencies extending over the variable bandwidth.

For further stabilizing the frequency of the oscillator against variations in the impedance of the input signal source or variations in the output impedance or load, the preferred oscillator is provided with a high input impedance and a low output impedance together with an additional input load stabilizing means. This latter means serves to maintain the frequency constant despite changes in the impedance of the input signal source over a range extending substantially from zero impedance, should the input signal source become short circuited, to infinite impedance, should the source become disconnected from the oscillator. This latter frequency stabilizing means provides the further advantage of permitting the input transducer, strain gage or other signal source to be directly coupled to the oscillator through a resistance network, thereby eliminating the need for additional transistor coupling or buffer stages, customarily required for interconnecting the transducer to the oscillator. Eliminating these additional stages provides a further reduction in the size and weight of the oscillator system.

As a still further feature of the invention, there is provided a desaturating circiut for automatically restoring the oscillator to its normal functioning condition should the transistors become saturated when the oscillator is operating in the higher frequency regions, for example in the frequency range from 30 to 70 kilocycles or greater. The desaturating circuit responds only to the cessation of the normal oscillating condition of the transistors to provide feedback pulses to the transistors in such manner as to trigger the transistors out of a saturation condition.

It is accordingly a principal object of the invention to provide a voltage controlled variable frequency oscillator of miniature size and weight that is stabilized against variation in frequency occasioned by temperature change or change in the impedance of the input voltage source.

A further object is to provide such an oscillator that may be directly coupled to the input source, thereby eliminating one or more input stages that are normally required in known circuits.

Another object is to provide such an oscillator comprised of transistors and having automatically operating desaturating means for restoring the oscillator to normal functioning should the transistors become saturated at higher frequencies.

Other objects and additional advantages will be more readily understood and appreciated by those skilled in the art after a detailed consideration of the following specification taken with the accompanying drawings, wherein:

FIG. 1 is an electrical schematic illustration of one preferred voltage controlled oscillator system according to the invention, and FIG. 2 is an electrical schematic illustration of an alternative switching amplifier circuit which may be substituted for the desaturating circuit in FIG. 1, where the oscillator is employed in a lower frequency range.

Referring now to the drawings for a detailed consideration of preferred embodiments of the invention, the oscillator stage is comprised of a multivibrator having a pair of transistors 10 and 11 being mutually interconnected in feedback relationship by means of resistor-capacitor time constant networks. Thus, the collector electrode of transistor 10 is connected through capacitor 15 to the base electrode of transistor 11 and the collector electrode of transistor 11 is connected to the base electrode of transistor 10 through capacitor 17. The collector electrodes of transistors 10 and 11 are each energized by a regulated source of voltage potential on line 24 through a different one of resistors 21 and 22, and the emitter electrodes of both transistors are connected to ground 23, thereby to apply the energizing voltage across the collector-emitter electrodes of both transistors. Having this mutual feedback connection, and by the proper selection of the values of these resistors and capacitors, the multivibrator circuit is rendered astable, with each of the transistors 10 and 11 being switched on and off in a regular cyclic manner and at a frequency determined by the parameters of the circuit.

The frequency of oscillation of this circuit is controllable by the voltage potential being applied to the base electrodes of the transistors, and for the purpose of establishing a desired base frequency of operation, a stabilized biasing potential being produced over line 25 is applied jointly to both transistors; being applied to the base of transistor 10 through resistor 20 and being applied to the base of transistor 11 through resistor 19.

The input control signal for linearly changing the frequency of the multivibrator is introduced over line 27 and is directly coupled to the base electrodes of both transistors 10 and 11 through a resistance potential divider comprising resistors 28, 30, 31, 32, and thermistor 29, said divider providing a high input resistance to the transducer. The output signal from the resistance voltage divider is taken from the movable tap of potentiometer 31 and directed over line 26 and thence branched through coupling resistors 18 and 16, each being connected to a different one of the base electrodes of the two transistors 10 and 11. A variation in the amplitude of the input signal on line 27 produces a corresponding variation in the voltage energizing the base electrodes of the transistors 10 and 11 thereby varying the frequency of the multivibrator in direct proportion thereto. It is to be particularly noted that this input potential divider serves to directly couple the input signal from a sensor, strain gage or other transducer (not shown) to the multivibrator, thus eliminating the need for a transistor buffer stage or stages commonly required in prior art circuits. The high input impedance of this resistance potential divider serves to isolate the low impedances of the transducer source from the multivibrator thereby directly coupling the input signals without loading the output of the transducer which loading would normally result in erroneous variations in the frequency thereof.

According to the invention there is provided a compensating means in the multivibrator stage for stabilizing the frequency of the multivibrator against changes in input loading due to variations in the impedance of the input signal source over a range extending substantially from zero impedance to infinite impedance. A zero input impedance would, for example, occur if the input transducer should become short circuited, and an infinite input impedance would occur if the input transducer should become open circuited. In either instant, such a radical change in the impedance of the transducer or its connecting lines would normally bring about an undesired change in the operating frequency of the multivibrator. According to the invention it has been found that the mutivibrator frequency may be stabilized against such changes in the input transducer impedance by providing additional resistors 13 and 14, for directly coupling together the collector electrodes of the two transistors. These additional resistances 13 and 14 serve to limit the extent of voltage differential occurring between the transistor collectors and, in turn, average the potential occurring at the transistor base electrodes which are coupled in mutual feedback to these collector electrodes as described above. As a result, should the impedance of the input transducer (not shown) fall to zero, become substantially infinite, or otherwise vary within this range, the voltage being applied to the base electrodes of the transistors does not appreciably vary whereby the frequency of the multivibrator stage is maintained substantially constant, as is desired.

To compensate for temperature changes affecting the transistors 10 and 11, it has also been found necessary to vary the value of these additional stabilizing resistances 13 and 14 in a direction opposite to the changes occurring in the transistors 10 and 11. For this purpose, the resistor 14 is provided as a thermistor or the like, having a known positive coefficient of resistance change with temperature. In this manner, the frequency of the multivibrator stage is stabilized both against variations in the input transducer impedance, and additionally stabilized over a wide range of temperature variations.

Although this stabilizing resistance circuit interconnecting the collector electrodes is disclosed in a preferred form as a pair of series connected resistor elements 13 and 14, other resistance networks having the same electrical temperature sensitive characteristics may, of course, be employed.

For additionally stabilizing the frequency of the multivibrator stage against spurious temperature changes, two additional temperature compensating means are employed in the circuit to vary the input signal and bias potential being applied to the base electrodes of the transistors. In the input potential divider network, for directly coupling the transducer (not shown) to the base electrodes, a thermistor 29, or other impedance device having a negative coefficient of resistance change with temperature, is employed. This thermistor 29 is placed in the input portion of the potential divider network whereby upon an increase in temperautre causing the impedance of thermistor 29 to be lowered, a greater proportion of the transducer input signal is applied over line 26 to the base electrodes of the transistors 10 and 11, thereby stabilizing the signal input channel against spurious temperature caused variations in the transducer or input source.

In the circuit network for applying the biasing potential over line 25 to the base electrodes of the transistors 10 and 11, there is provided an additional temperature sensitive impedance, such as the thermistor 43. This bias applying resistance network, like the input signal network, is preferably comprised of a resistance potential divider network including resistors 42, 44, 45, 47, thermistor 43, and a series connected resistor 46 for interconnecting the movable tap of potentiometer 45 with the biasing line 25 leading to the base electrodes of both transistors through the coupling resistors 19 and 20, as described above. A stabilized energizing potential is applied to the upper terminal of resistor 42, forming the input of the potential divider network, and a variable proportion of this potential is obtained at the movable tap of potentiometer 45 and ultimately directed to bias the base electrodes. The temperature variable thermistor 43 or other element having a positive coefficient of resistance change with temperature, serves to compensate for temperature variations in the Zener diodes 35 and 36 and other components of the power supply and in the transistors 10 and 11 to stabilize the multivibrator frequency, as desired. Thus in the absence of an input signal from the transducer (not shown) the thermistor 43 and 14 stabilize the multivibrator base frequency against temperature variations, and the thermistor 29 in the input resistance network corrects for temperature caused variations when a signal is applied to the oscillator input.

The voltage regulated power supply for providing the energizing voltages to the multivibrator and subsequent stages is obtained from a network including the pair of Zener diodes 35 and 36 together with series connected resistors 34 and 37. An external voltage potential, which may itself be regulated, but not precisely, is applied to terminal 33 and current is passed in series through line dropping resistors 34, 37, and 41 to the multivibrator stage. The potential junction between resistors 34 and 37 is stabilized by the Zener diode 35 being connected from this junction to ground, and similarly the junction between resistors 37 and 41 is stabilized by Zener diode 36. Due to the line dropping resistors 34, 37, and 42, the voltage potential at each of these terminals is progressively less than at the previous terminal to provide a series of diffeernt stabilized voltages at terminals 39, 40, an over line 24 as required for energizing and biasing the transistors.

A further advantage of the preferred circuit as described is the fact that all the transistors are operated in the on-off switching mode, and consequently the varying conductivities and gain of the transistors with temperature change do not vary the multivibrator frequency provided that the potentials at the electrodes are controlled as described above. The preferred output circuit stages for coupling the multivibrator to an output load also functions in the switching mode and is accordingly substantially unaffected by temperature variations, as will be discussed hereafter.

FIG. 2 illustrates a preferred output coupling circuit, operating in the switching mode, for coupling the multivibrator stage to a load (not shown). To stabilize the frequency of the multivibrator despite changes in the output load impedance, the coupling circuit is provided with a high input impedance and a low output impedance thereby to effectively isolate or buffer the load impedance from the oscillator. For providing this high input impedance desired, the coupling stages comprise a pair of cascaded transistors 65 and 67 with the emitter electrode of the first transistor 65 being connected in series circuit with a resistor 66 and with the base-emitter junction of the second transistor 67. In operation, the repetitively produced pulses from the multivibrator are directed over line 48 to the base electrode of the transistor 65 with each pulse received switching the transistor 65 into a conducting condition; and in the interval between pulses, the transistor 65 is rendered non-conducting. Upon transistor 65 becoming conducting, a pulse is directed to the second transistor 67 rendering the second transistor conducting and drawing current flow through a potentiometer 68 in its collector-emitter circuit. Thus in response to each multivibrator pulse, there is produced a pulse of current through potentiometer 68 and a voltage pulse over line 69 leading from its adjustable terminal which may be directly conveyed to a load (not shown). In the event that a sinusoidal output waveform is desired for telemetering or related purposes, the pulse on line 69 may be directed through a low pass filtering network including capacitor 60, resistor 61, and other well-known portions of a low pass filter indicated at 62, to provide a variable frequency sinusoidal wave over output line 64 leading to the load (not shown).

In the event that the voltage controlled oscillator of the invention is to be employed at higher ranges of frequencies, such as at frequencies extending from 40 to 70 kilocycles or higher, there is a tendency for the multivibrator transistors 10 and 11, of types presently available on the market, to become saturated, or discontinue switching on and off and instead enter into a continuous conducting condition. This saturating condition may be relieved by independently pulsing the base electrodes of the transistors 10 and 11 in such manner as to desaturate the transistors.

According to the invention, there is provided a desaturating circuit for automatically detecting when this saturation condition occurs and applying feedback desaturating pulses to the transistors 10 and 11. This preferred circuit is shown in FIG. 1, being intimately combined with the output coupling circuit. As shown, the output pulses from the multivibrator are initially conveyed over line 48 to the base electrode of a switching transistor 49, which transistor 49 is thereby continuously switched on and off for each received pulse when the oscillator is functioning properly. For each switching cycle of transistor 49, a pulse is directed from its collector electrode and through a capacitor 54 and resistor 53 in a coupling circuit to the base electrode of a second transistor 50, thereupon switching the second transistor 50 on and off. As the second transistor 50 is rendered conducting during each cycle, current flows through its collector-emitter junction and through a resistor 75 to apply a charge on capacitor 57. In the interval between such pulses, a portion of the charge on 57 discharges through resistors 75 and 55. However, the time constant of capacitor 57 and resistors 75 and 55 is sufficiently long that the voltage stored on the capacitor 57 remains above a predetermined level so long as the transistor 50 is cycled on and off in a regularly recurring manner. On the other hand, should the transistors 10 and 11 of the multivibrator enter into a saturated condition, the pulses produced over line 48 cease, and the potential on line 48 falls to a constant low level. This drop in potential renders transistor 49 in a continuous nonconducting condition thereby raising the potential at its collector electrode and at the base of transistor 50, and enabling the coupling capacitor 54 to become charged from source 39 thereby rendering the base electrode of transistor 50 more negative and cutting off current conduction through the transistor 50. As a result, the capacitor 57 discharges through resistors 75 and 55 lowering its voltage below the predetermined level whereupon a pair of reversely poled diodes 58 and 59 are rendered conducting to enable current flow over feedback lines 25 and 26. Line 25 is the energizing line for applying biasing potential to the base electrodes of transistors 10 and 11 and, as described above, is normally maintained at a given positive level of voltage. Consequently when the voltage across desaturating capacitor 57 falls below the predetermined level of biasing potential, current is permitted to flow over line 25 and through diode 59 to the capacitor 57. However, as soon as such current flow commences, a voltage drop is produced across resistor 46 leading from the biasing resistor network, thereby lowering the potential on line 25 and applying a negative pulse to the base electrodes of both transistors 10 and 11. This negative pulse operates to desaturate the transistors 10 and 11 and restore the multivibrator to its proper oscillating condition.

In a similar manner, the second feedback line 26 is connected to the base electrodes through resistors 16 and 18 and to the input signal resistance network. Consequently if the voltage across desaturating capacitor 57 falls bolew the potential on line 26, a negative pulse is produced and is also directed to the transistors 10 and 11 operating to desaturate these transistors.

Thus, the desaturating circuit determines when the multivibrator has ceased operation and automatically produces negative feedback pulses to desaturate the transistors 10 and 11 and restore the circuit to proper operation. Upon the multivibrator resuming its normal cycling operation, the periodic conduction and nonconduction of transistors 49 and 50 raises the potential on capacitor 57 to its predetermined level above the potential on feedback lines 25 and 26 and hence disables the desaturating circuit from further operation.

As generally indicated, this output coupling circuit also functions as an isolator to convey the frequency modulated signals from the multivibrator to an output line 64 leading to a load (not shown), while impedance isolating the load from the multivibrator circuit. This is performed by also employing the transistor 50 as an emitter-follower type switching amplifier. The multivibrator pulses directed from transistor 50 are applied across potentiometer 55 and directed from the movable output terminal 56. These pulses may be filtered through a low pass filtering means including capacitor 60, resistor 61 and the remaining filter elements, generally designated 62, to convert the pulses into a variable frequency sinusoidal waveform at output line 64 as may be desired for telemetering or other applications.

Although but one preferred embodiment of the invention has been illustrated and described, many variations may be made without departing from the spirit and scope of this invention. Accordingly this invention should be considered as being limited only according to the following claims appended hereto.

What is claimed is:

1. In a voltage controlled variable frequency multivibrator oscillator comprised of a pair of transistors interconnected in mutual feedback relationship, each transistor having base, collector and emitter electrodes, a first resistance means for directly coupling a variable voltage input signal source to directly energize both base electrodes, a second resistance means for directly coupling a bias voltage to energize both base electrodes, and means for compensating against variation in the frequency of the multivibrator despite a change in the impedance of the input voltage source over a range extending from substantially zero impedance to infinite impedance.

2. In the oscillator of claim 1, said means for compensating comprising a third resistor means in circuit directly interconnecting the collector electrodes of both transistors.

3. In the oscillator of claim 1, a resistor for each transistor for directly coupling the collector electrodes of each transistor to an energizing potential, and said compensating means comprising a third resistor means in circuit directly interconnecting the collector electrodes of both transistors.

4. In the oscillator of claim 3, said third resistance means including a temperature variable impedance for varying the impedance interconnecting the collector electrodes thereby to compensate for variations in the transistors with temperature.

5. In the oscillator of claim 1, said second resistance means including a temperature compensating impedance for varying the bias voltage to the base electrodes with change in temperature in opposition to the variations with temperature of the transistors.

6. In the oscillator of claim 1, said first resistance means including a temperature compensating impedance for varying the input voltage signal to the transistors with change in temperature.

7. In the oscillator of claim 1, said first resistance means including a temperature compensating impedance, said second resistance means including a temperature compensating impedance, and said impedance compensating means comprising a third resistance means in circuit directly interconnecting the collector electrodes of both transistors.

8. In the oscillator of claim 7, said third resistance means including a temperature compensating impedance, said temperature compensating impedances in said second resistance means and in said third resistance means both having the same polarity of temperature coefficient with change in temperature, and said temperature compensating impedance in the first resistance means having the opposite polarity of temperature coefficient.

9. In a voltage controlled variable frequency multivibrator comprised of a pair of transistors, each having base, collector, and emitter electrodes, with resistance-capacitance means interconnecting the collector of each transistor to the base of the other transistor in mutual feedback relationship, first resistance means for directly coupling a variable voltage input source to energize the base elctrodes of both transistors, second resistor means for coupling a bias energizing source to the base electrodes of both transistors, third resistance means for coupling an energizing source to the collector electrodes of both transistors, said first resistance means and second resistance means both including a temperature compensating impedance; with said compensating impedances having a negative temperature coefficient, and means intercoupling the collector electrodes of both transistors to compensate against variation in the frequency of the multivibrator with change in the impedance of the input voltage source over a range extending from substantially zero impedance to infinite impedance, said intercoupling means including a temperature compensating impedance having a positive temperature coefficient.

10. In the multivibrator of claim 9, said intercoupling means consisting of a pair of resistors, one of said resistors being a thermistor.

11. In the multivibrator of claim 9, said first resistance means comprising a high input resistance potential divider including a thermistor and a variable potentiometer for directly coupling the variable voltage input source to the multivibrator, and said second resistance means comprising a resistance potential divider including a thermistor and a potentiometer for applying a bias potential to said base electrodes.

12. In a voltage controlled variable frequency oscillator responsive to a low input impedance variable voltage signal originating from a transducer for providing a variabl frequency sinusoidal output wave linearly proportional thereto over a wide range, a resistance-capacitance coupled multivibrator circuit including a pair of transistors having base, collector, and emitter electrodes, means for directly coupling a low impedance input source to the base-emitter electrodes of the transistors, said means comprising a high input impedance potential divider including a temperature compensating resistor, a second potential divider including a temperature compensating resistance for coupling a biasing potential to energize the base-emitter electrodes of the transistors, resistance means for applying direct current energization to the collector-emitter electrodes of both transistors, and means for stabilizing the frequency of the multivibrator despite variation of the impedance of the input voltage source over a range extending substantially from zero to infinity, a switching amplifier circuit directly coupled for energization by said multivibrator to cyclically switch on and off for each cycle of the multivibrator, and a filtering circuit being energized by said switching amplifier to produce an output sinusoidal waveform having a frequency proportional to the multivibrator frequency.

13. In combination with the multivibrator of claim 12, a high frequency starter circuit for automatically desaturating the multivibrator upon its attaining a saturated condition, said starter circuit including a capacitor means responsive to the cessation of cycling of the multivibrator to provide a reduced voltage potential, and means responsive to said reduced potential to apply desaturating impulses to the base electrodes of said transistors through both said potential divider and said second potential divider.

14. An antisaturation circuit for a pulsing transistor system, comprising a capacitor and a discharge resistor, means coupling the pulsing output of the transistor system to cyclically charge said capacitor; the time constant of the capacitor and discharge resistor being such as to only partially discharge the capacitor in the interval between pulses, said coupling means being provided with means for preventing charge of said capacitor in the absence of pulsing operation of said transistor system occasioned by saturation thereof, thereby to enable the further discharge of said capacitor to a voltage below its normal operating level, and means responsive to the voltage across said capacitor falling below a given level for applying a desaturating impuse to said transistor system.

15. A desaturating circuit for a transistor multivibrator circuit comprising a switching transistor being energized by impulses from the multivibrator, a first capacitor and discharge resistor coupled to said transistor, said capacitor being alternately charged and discharged responsively to said impulses and being maintained in a more highly charged condition upon the multivibrator being saturated, a second capacitor and discharge resistor coupled to said first capacitor and resistor and being maintained in a lesser charged condition upon said first capacitor being more highly charged, and means selectively responsive to the lesser charged condition of the second capacitor for applying desaturating impulses to the multivibrator.

References Cited by the Examiner

UNITED STATES PATENTS

| | | | |
|---|---|---|---|
| 2,356,071 | 8/1944 | Macdonald et al. | 331—114 |
| 2,548,737 | 4/1951 | Morris | 331—144 X |
| 2,984,729 | 5/1961 | Hykes et al. | |
| 2,990,478 | 6/1961 | Scarbrough | 307—88.5 |
| 3,010,073 | 11/1961 | Melas | 331—113 X |
| 3,100,285 | 8/1963 | Clynes | 331—113 X |
| 3,142,025 | 7/1964 | Roberts | 331—113 |

FOREIGN PATENTS

| | | |
|---|---|---|
| 884,363 | 12/1961 | Great Britain. |

ROY LAKE, *Primary Examiner.*

JOHN KOMINSKI, *Examiner.*

S. H. GRIMM, *Assistant Examiner.*